United States Patent
Ogasawara

(10) Patent No.: US 6,642,675 B2
(45) Date of Patent: Nov. 4, 2003

(54) CHARGED PARTICLE BEAM EXPOSING APPARATUS

(75) Inventor: Munehiro Ogasawara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/097,020

(22) Filed: Mar. 14, 2002

(65) Prior Publication Data

US 2002/0140383 A1 Oct. 3, 2002

(30) Foreign Application Priority Data

Mar. 29, 2001 (JP) ....................... 2001-097160

(51) Int. Cl.[7] ................................ H01J 29/56
(52) U.S. Cl. .................... 315/370; 250/396 R
(58) Field of Search ............ 315/370, 368.15, 315/368.11, 364, 391; 250/396 R, 396 ML, 398, 492.2; 313/412, 413, 414

(56) References Cited

U.S. PATENT DOCUMENTS

| | | | |
|---|---|---|---|
| 5,389,858 A | | 2/1995 | Langner et al. ............. 315/370 |
| 5,481,164 A | * | 1/1996 | Langner et al. ............. 315/370 |
| 5,825,123 A | * | 10/1998 | Retsky ....................... 313/413 |
| 5,912,469 A | * | 6/1999 | Okino ....................... 250/396 R |
| 6,180,947 B1 | * | 1/2001 | Stickel et al. ........... 250/396 R |
| 6,222,197 B1 | * | 4/2001 | Kojima .................. 250/492.22 |
| 6,333,508 B1 | * | 12/2001 | Katsap et al. ............ 250/492.2 |

FOREIGN PATENT DOCUMENTS

JP 2946537 2/1999

OTHER PUBLICATIONS

Shiego Okayama, "Electrom–beam lithography system using a quadrupole triplet", Journal of Vacuum and Science Technology, B 6 (1), Jan./Feb. 1988, pp. 199–203.

T. Takigawa, et al., "Advanced e–beam lithography", Journal of Vacuum and Science Technology, B9 (6), Nov./Dec. 1991, pp. 2981–2985.

* cited by examiner

Primary Examiner—Don Wong
Assistant Examiner—Ephrem Alemu
(74) Attorney, Agent, or Firm—Oblon, Spivak, McClelland, Maier & Neustadt, P.C.

(57) ABSTRACT

A charged particle beam exposing apparatus has an electromagnetic lens and a deflector, and performs pattern lithography by converging a charged particle beam on a sample by the electromagnetic lens and controlling an irradiation position on the sample by the deflector. At least two pairs of quadrupole field generators which generate a quadrupole field are provided along a beam axis so as to give converging force to the charged particle beam, and a focusing position of the charged particle beam is corrected by changing the intensity of the quadrupole field generators in accordance with a deflection position of the charged particle beam on the sample.

19 Claims, 7 Drawing Sheets

CHARGED PARTICLE BEAM EXPOSING APPARATUS

CROSS-REFERENCE TO RELATED APPLICATIONS

This application is based upon and claims the benefit of priority from the prior Japanese Patent Application No. 2001-097160, filed Mar. 29, 2001, the entire contents of which are incorporated herein by reference.

BACKGROUND OF THE INVENTION

1. Field of the Invention

The present invention relates to a charged particle beam exposing apparatus configured to form a fine pattern on a sample, and more particularly to a charged particle beam exposing apparatus having a dynamic focus correction function of an optical system devoted to converging, deflection or the like of a charged particle beam.

2. Description of the Related Art

In an electron beam exposing apparatus configured to form a fine pattern on a semiconductor wafer or an optical mask, there is employed a variable shaped beam method or a character projection method which uses a circular beam or generates a beam having a cross section of a rectangle, a triangle or an arbitrary pattern for lithography.

FIG. 1 shows an example of a prior art electron beam exposing apparatus adopting the variable shaped beam method. In the drawing, reference numeral 10 denotes an electron gun; 11, a first shaping aperture; 12, a first projection lens; 13, a shaping deflector; 14, a second projection lens; 15, a second shaping aperture; 16, a reduction lens; 18, an objective deflector; 19, an object lens; 20, a sample base (sample plane); and 21, a reduced image.

In this apparatus, a beam having a desired shape is formed by varying the optical overlap of the first shaping aperture 11 and the second shaping aperture 15 by using the shaping deflector 13, and a position of the reduced image 21 is determined on the sample plane 20 by deflecting the beam by using the objective deflector 18.

In the above-described apparatus, when the electron beam irradiation position is moved to a position distanced from a center of the object lens 19, there occurs a problem that an image forming position deviates from the sample plane 20 toward the upstream side by the field curvature aberration. Similarly, as shown in FIG. 2, even when transferring a large pattern (character pattern) on an EB (Electron Beam) mask 80 onto the sample plane 20 by scanning this pattern with the electron beam, there is produced a problem that a focusing position deviates in accordance with a distance from the central axis on the pattern. Further, the sample plane is not necessarily always flat, and a height of the sample plane differs depending on a position on the sample pattern. Therefore, there may occurs a problem that a focal point may deviate in accordance with a position on the sample plane.

As a countermeasure for this problem, the image forming position can be adjusted to be placed on the sample plane 20 by varying the excitation of the object lens 19 in accordance with a deflection position on the sample plane 20. However, the object lens 18 is generally an electromagnetic lens, and it is difficult to change the excitation at a high speed.

On the other hand, as shown in FIG. 3, correction can be performed by providing an axial symmetric electrostatic lens 90 in the middle of a beam axis (optical axis). However, there is a restriction in design such that the independent axial symmetric electrostatic lens can not be placed at the same position as the deflector. Furthermore, Published Japanese Patent No. 2946537 discloses a method by which the entire potentials of the electrostatic deflector are simultaneously changed so that the deflector can be substantially used as the axial symmetric electrostatic lens. According to this method, the energy of the electrons is locally changed by varying the potentials so that the focal distance is changed. This method, however, has a drawback that the sensitivity for changing the focal distance is low.

As described above, in the conventional electron beam exposing apparatus, when the electron beam is moved to a position distanced from the center of the object lens, there occurs a problem that the image forming position deviates from the sample plane toward the upstream side by the field curvature aberration. Even in the case that a large pattern on the EP mask is transferred onto the sample plane by scanning this pattern by using the electron beam, the focal position is disadvantageously shifted depending on a distance from the central axis on the pattern. Therefore, such a dynamic focal point must be corrected.

Although an image forming position can be adjusted to be positioned on the sample by changing the excitation of the object lens in accordance with a deflection position of the sample, it is difficult to change the excitation at a high speed in case of the object lens including an electromagnetic lens. Moreover, although correction can be performed by providing the axial symmetric electrostatic lens, the axial symmetric electrostatic lens can not be placed at the same position as the deflector, which results in increase in the optical system. In addition, the axial symmetric electrostatic lens has a drawback that the sensitivity for changing a focal distance is low.

Additionally, these problems are not restricted to the electron beam exposing apparatus, and an ion beam exposing apparatus also has such problems.

Thus, it is necessary to realize a charged beam exposing apparatus which can perform dynamic focus correction for a charged particle beam at a high speed and improve the accuracy in lithography.

BRIEF SUMMARY OF THE INVENTION

According to a first aspect of the present invention, there is provided a charged particle beam exposing apparatus comprising:

a charged particle beam gun;

a first shaping aperture which forms a charged particle beam from the beam gun into a predetermined shape and passes it therethrough;

a first projection lens provided on a downstream side of the first shaping aperture and passes it therethrough;

a shaping deflector which deflects the charged particle beam which passes through the first projection lens;

a second projection lens on which the charged particle beam which passes through the shaping deflector is incident;

a second shaping aperture which forms the charged particle beam which passes through the second projection lens into a predetermined shape and passes it therethrough;

a reduction lens on which the charged particle beam which passes through second shaping aperture is incident;

an objective deflector which is provided on the downstream side of the reduction lens and deflects the charged particle beam which passes through the reduction lens;

an object lens on which the charged particle beam which passes through the objective deflector is incident;

a sample base provided on the downstream side of the object lens; and at least two pairs of quadrupole field generators which are provided along a beam axis between the second shaping aperture and the sample base so as to give the focusing force to the charged particle beam and generate a quadrupole field, a field intensity of the quadrupole field generators being variable in accordance with a deflection position of the charged particle beam on a sample mounted on the sample base in order to correct a focusing position of he charged particle beam.

According to a second aspect of the present invention, there is provided a charged particle beam exposing apparatus comprising:

a charged particle beam gun;

a shaping aperture which forms a charged particle beam from the beam gun into a predetermined shape and passes it therethrough;

a first projection lens which is provided on a downstream side of the shaping aperture;

a shaping deflector which deflects the charged particle beam which passes through the first projection lens;

a second projection lens on which the charged particle beam which passes through the shaping deflector is incident;

a mask which forms the charged particle beam which passes through the second projection lens into a predetermined pattern and passes it therethrough;

a reduction lens on which the charged particle beam which passes through the mask is incident;

an objective deflector which is provided on the downstream side of the reduction lens and deflects the charged particle beam;

an object lens on which the charged particle beam which passes through the objective deflector is incident;

a sample base provided on a downstream side of the object lens; and at least two pairs of quadrupole field generators which are provided along a beam axis between the second shaping aperture and the sample base so as to give the converging force to the charged particle beam and generate a quadrupole field, a field intensity of the quadrupole field generators being variable in accordance with a deflection position of the charged particle beam on a sample mounted on the sample base in order to correct a focusing position of the charged particle beam.

In the charged particle beam exposing apparatus according to the second aspect, the quadrupole field generators may be provided between the shaping aperture and the mask.

DETAILED DESCRIPTION OF THE INVENTION

In the following embodiments, quadrupole field generators provided at a plurality of positions along a beam axis are used to correct the converging force of an electron beam, thereby enabling correction of a dynamic focal point of a beam. In this case, the quadrupole field generators can also serve as various kinds of deflectors, and the optical system can be thereby prevented from being increased in size by providing these quadrupole field generators. Further, the quadrupole field generators can change a focusing position at a high speed as different from an object lens or an axial symmetric electrostatic lens consisting of an electromagnetic lens, thus enabling dynamic focal point correction at a high speed.

Preferred embodiments of the present invention will now be described hereinafter with reference to the accompanying drawings. Incidentally, although an electron beam is considered as a charged particle beam, there is substantially no difference even if an ion beam is used.

(First Embodiment)

Figure 1:
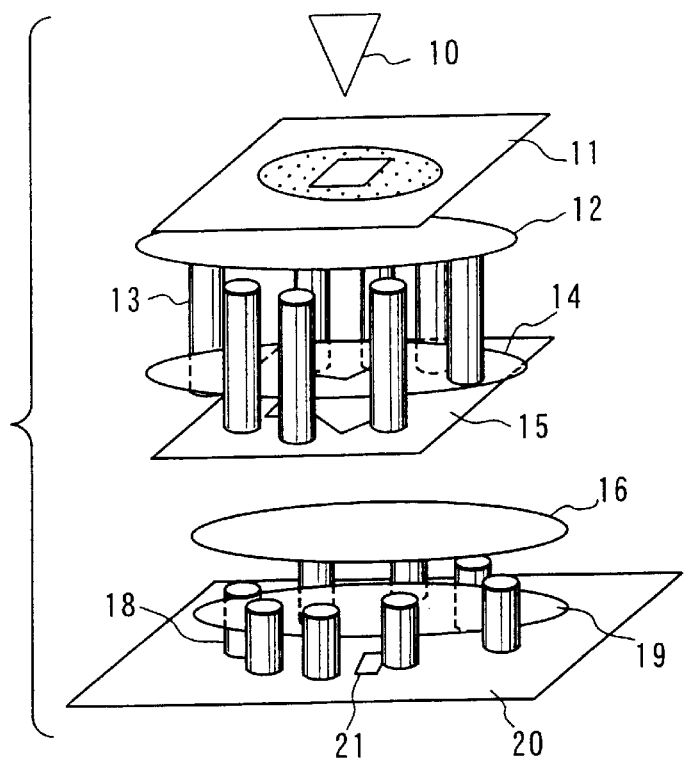
FIG. 1 is a schematic view showing a structure of an optical system in a conventional electron beam exposing apparatus adopting a variable shaped beam method.
Figure 2:
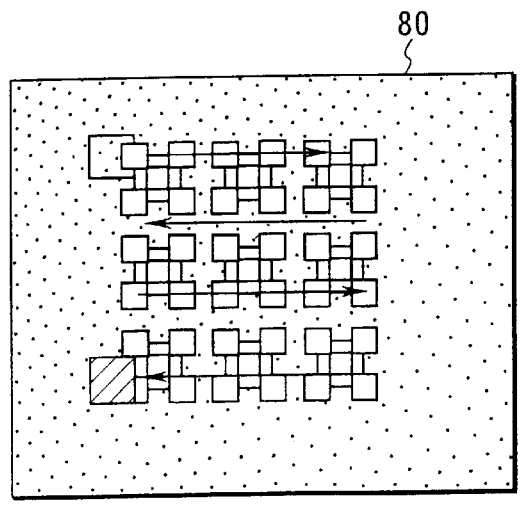
FIG. 2 is a view illustrating an example of transferring a large pattern on an EB mask onto a sample plane by scanning this pattern with an electron beam.
Figure 3:
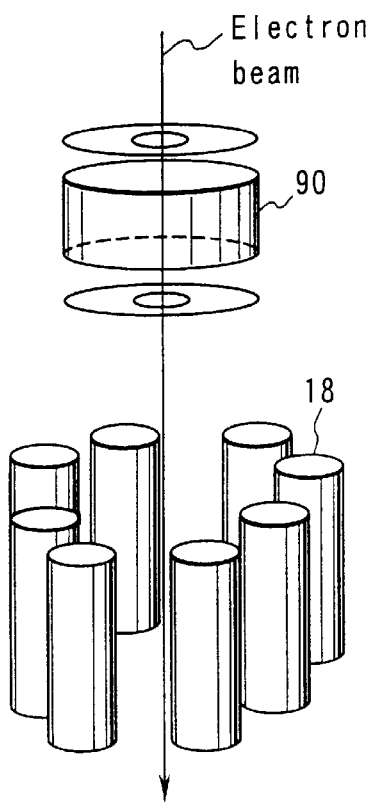
FIG. 3 is a view showing an example of performing correction by providing an axial symmetric electrostatic lens in a prior art apparatus.
Figure 4:
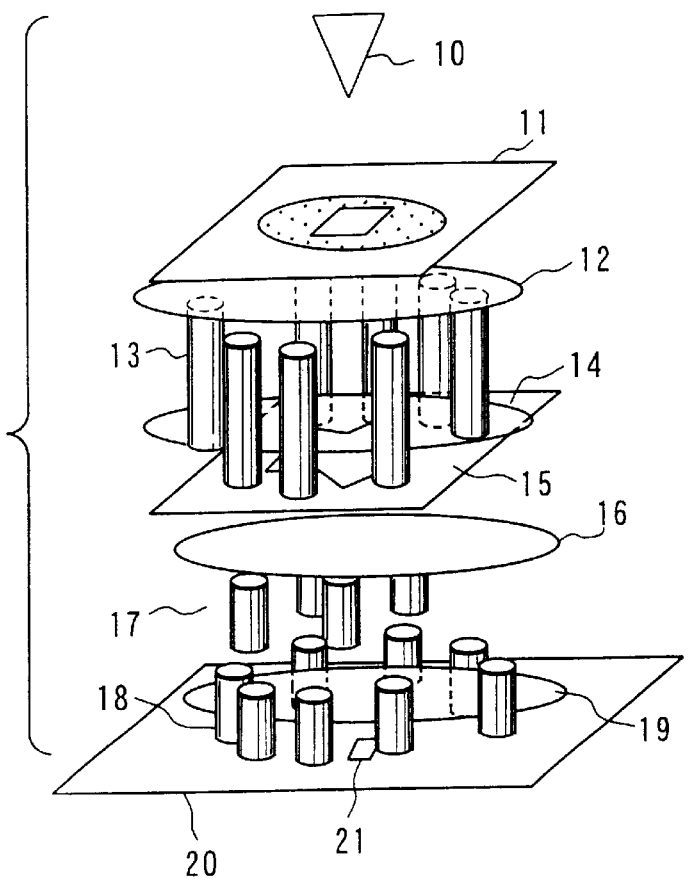
FIG. 4 is a schematic view showing a structure of an optical system in an electron beam exposing apparatus according to a first embodiment.

FIG. 4 is a view showing a structure of an optical system in an electron beam exposing apparatus according to a first embodiment.

In FIG. 4, reference numeral 10 denotes an electron gun, and a first shaping aperture 11 is irradiated with an electron beam generated by the electron gun 10 through a non-illustrated condensing lens or the like, and the electron beam turns into a rectangular beam. A second shaping aperture 15 is provided on the downstream side of the first shaping aperture with a projection lenses 12 and 14 sandwiched between the first and second shaping apertures, and an image of the first shaping aperture 11 is formed on the second shaping aperture 15. A reduction lens 16 and an object lens 19 are provided between the second shaping aperture 15 and a sample plane 20, and a reduced image 21 of the second shaping aperture 15 is formed on the sample plane 20.

Here, shaping deflector 13 is provided between the first shaping aperture 11 and the second shaping aperture 15, and a position of the image of the first shaping aperture 11 on the second shaping aperture 15 is changed by the deflector 13. Therefore, among images of the first shaping aperture, one which has passed through the second shaping aperture 15 passes along the downstream side of the second shaping aperture 15, and a shape of the electron beam reduced image 21 formed on the sample plane 20 can be changed by the shaping deflector 13.

An objective deflector (main deflector) 18 is provided in the vicinity of the object lens 19, and an electron beam irradiation position on the sample plane 20 can be thereby set to a desired position.

The basic structure mentioned above is the same as that of the prior art apparatus. In addition to this, however, quadrupole electrodes (correction electrodes) 17 are provided on the upstream side of the objective deflector 18 in this embodiment, and the quadrupole electric field having the arbitrary intensity can be thus generated. Furthermore, the objective deflector 18 includes octopole electrodes, and voltages applied to respective electrodes can be independently controlled.

Incidentally, the quadrupole electrodes 17 are provided on the upstream side of the objective deflector in this embodiment, their positions are not restricted thereto, and providing these electrodes between the second shaping aperture and the sample plane can suffice.

Figures 5A, 5B:
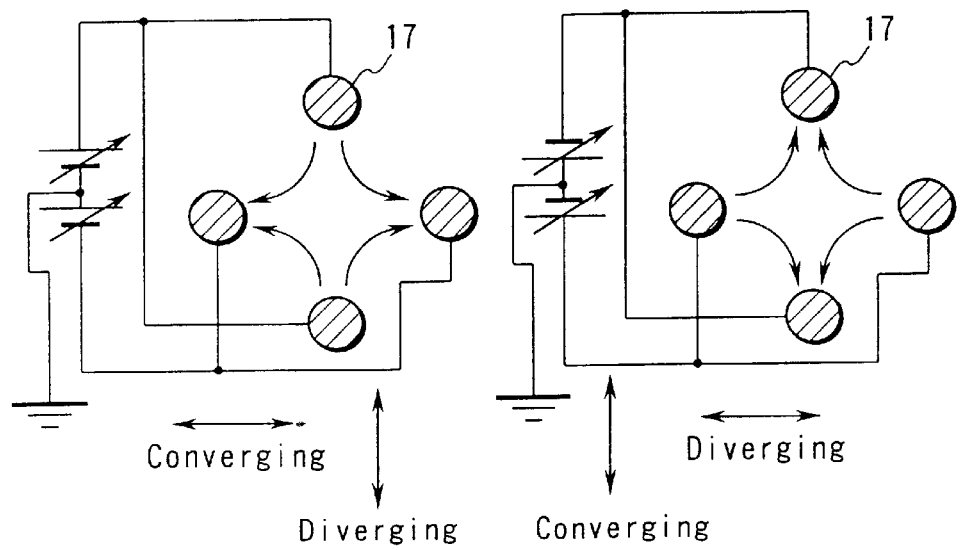
FIGS. 5A and 5B are views showing an example of a quadrupole field generated in correction electrodes.

FIGS. 5A and 5B show methods for generating a quadrupole electric field. Among four electrodes, the same potential is given to a pair of electrodes which are opposed to each other. Directions of the fields are as shown in FIG. 5A or FIG. 5B depending on a direction of a direct current voltage applied between one pair of electrodes and the other pair of electrodes. In any case, converging and diverging of the electron beam occur in directions orthogonal to each other.

Figure 6A:
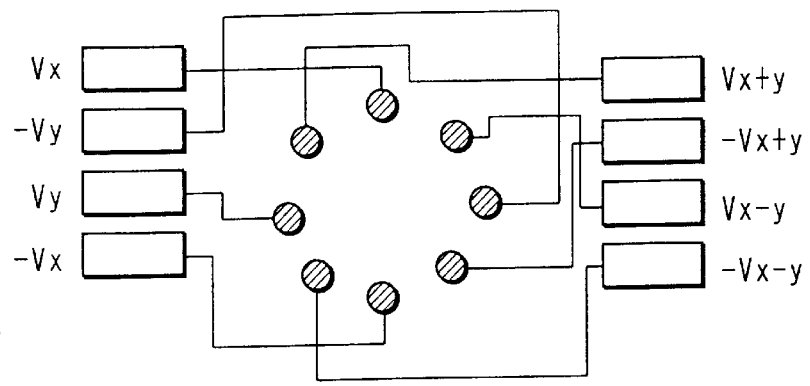
FIG. 6A is a view showing an example of voltage application in order to generate a deflection electric field in the octopole objective deflector.
Figure 6B:
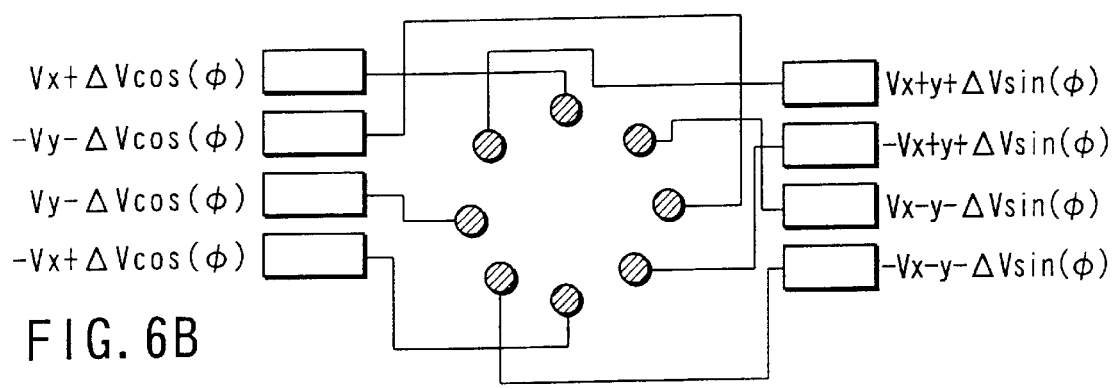
FIG. 6B is a view showing an example of voltage application in order to superpose a quadrupole electric field on a deflection electric field in the octopole objective deflector.

Here, in the correction electrodes 17, any quadrupole electric field shown in FIG. 5A or 5B is generated, and a quadrupole electric field is generated so as to be superposed on the deflection electric field also in the objective deflector 18 as shown in FIG. 6B. Moreover, the converging force can be produced by adjusting the intensity of the quadrupole electric field obtained by the correction electrodes 17 on the upstream side and the direction and intensity of the quadrupole electric field obtained by the objective deflector 18 on the downstream side. In addition, essential image formation of the electron beam is carried out by the electromagnetic lens (the reduction lens 16 and the object lens 19), and the quadrupole electric field is used only for correction, thereby enabling focus correction with the high sensitivity which can not be realized by the quadrupole electric field alone.

Here, description will be given as to the mechanism of generation of the deflection electric field on which the quadrupole electric field is superposed shown in FIG. 6B. At first, in case of forming the deflection electric field by the octopole electrodes, voltages are applied to the respective electrodes as shown in FIG. 6A. In FIGS. 6A and 6B, however, appellations of the electrodes are determined as follows. That is, it is determined that the appellation of a pair of opposing electrodes is (x, −x); the appellation of a pair of electrodes orthogonal to the former pair, (y, −y); the appellations of an electrode between x and y and an electrode opposed to this electrode, ((x+y), −(x+y)); and the appellations of an electrode between x and −y and an electrode opposed to this electrode, ((x−y), −(x−y)).

In FIG. 6A, in case of generating the deflection electric field which is inclined from the horizontal direction (y−(−y) direction) by θ in the counterclockwise direction, the voltages applied to the respective electrodes are as follows. It is to be noted that $V_0$ is a constant.

$Vx=V_0 \cos(90°−θ)$, $Vx−y=V_0 \cos(45°−θ)$, $−Vy=V_0 \cos(0°−θ)$, $−Vx+y=V_0 \cos(−45°−θ)$, $−Vx=V_0 \cos(−90°−θ)$, $−Vx−y=V_0 \cos(−135°−θ)$, $Vy=V_0 \cos(180°−θ)$, $Vx+y=V_0 \cos(135°−θ)$.

Although the deflection electric field is formed by applying the voltages to the respective electrodes as described above, the quadrupole electric field can be superposed on the deflection electric field by further superposing voltages such as shown in FIG. 6B. Incidentally, although φ in the superposing voltage corresponds to an angle of inclination from the horizontal direction (y−(−y) direction) in the counterclockwise direction, an angle of rotation of the quadrupole electric field becomes φ/2.

Figure 6C:
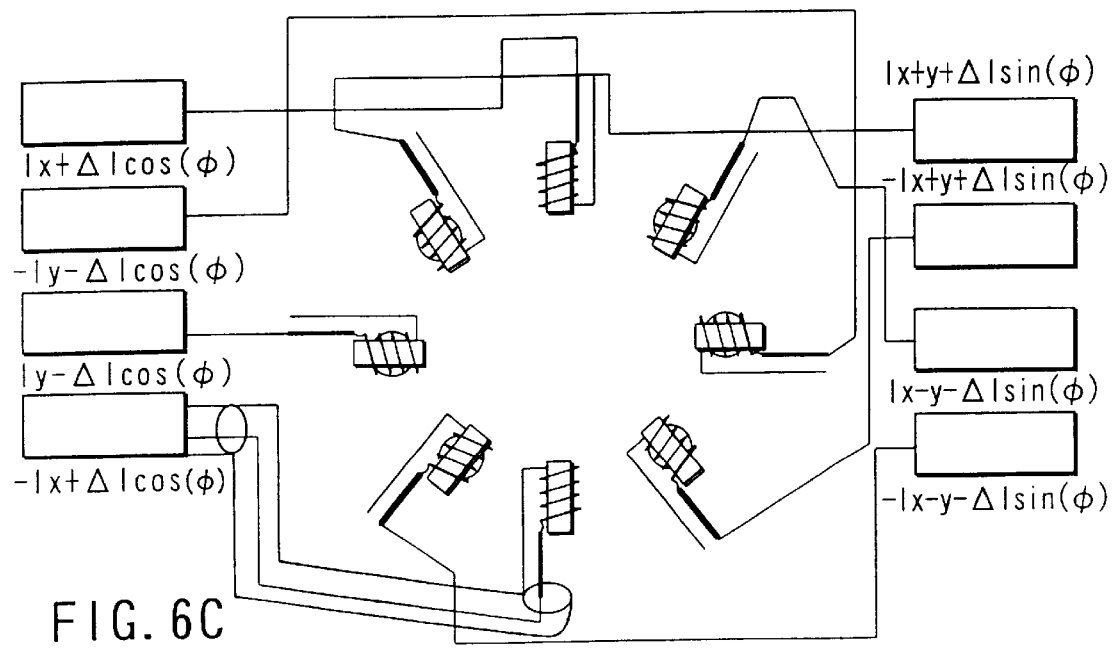
FIG. 6C is a view showing an example of an energizing electric current in order to superpose a quadrupole magnetic field on a deflection magnetic field in the octopole objective deflectors.

Furthermore, the deflection magnetic field can be formed by using octopole electrode magnetic coils and the quadrupole electric field can be superposed thereon. In this case, the energizing electric current of respective coils are as shown in FIG. 6C. Note that, in FIG. 6C, an interconnection for return current is shown only on one pole for easiness to see. Although φ in the superposing electric current corresponds to an angle of inclination from the horizontal direction (y−(−y) direction) in the counterclockwise direction, an angle of rotation of the quadrupole electric field becomes φ/2.

In this case, the deflection magnetic field inclined with respect to the horizontal direction by θ can be obtained by setting the electric current caused to flow to each coil as follows. $I_0$ is a constant.

$Ix=I_0 \cos(90°−θ)$, $Ix−y=I_0 \cos(45°−θ)$, $−Iy=I_0 \cos(0°−θ)$, $−Ix+y=I_0 \cos(−45°−θ)$, $−Ix=I_0 \cos(−90°−θ)$, $−Ix−y=I_0 \cos(−135°−θ)$, $Iy=I_0 \cos(180°−θ)$, $Ix+y=I_0 \cos(135°−θ)$.

The correction electrodes 17 can be substituted by octopole electrodes. In the above-described objective deflector 18, although correction can be performed by generating the quadrupole field in accordance with a deflection range for the deflection astigmatism aberration correction, the quadrupole field required for focus correction can be generated in the same direction as the quadrupole electric field for the deflection astigmatism aberration correction in advance, and the direction and intensity of the quadrupole electric field can be adjusted by the correction electrodes 17.

Figure 7:
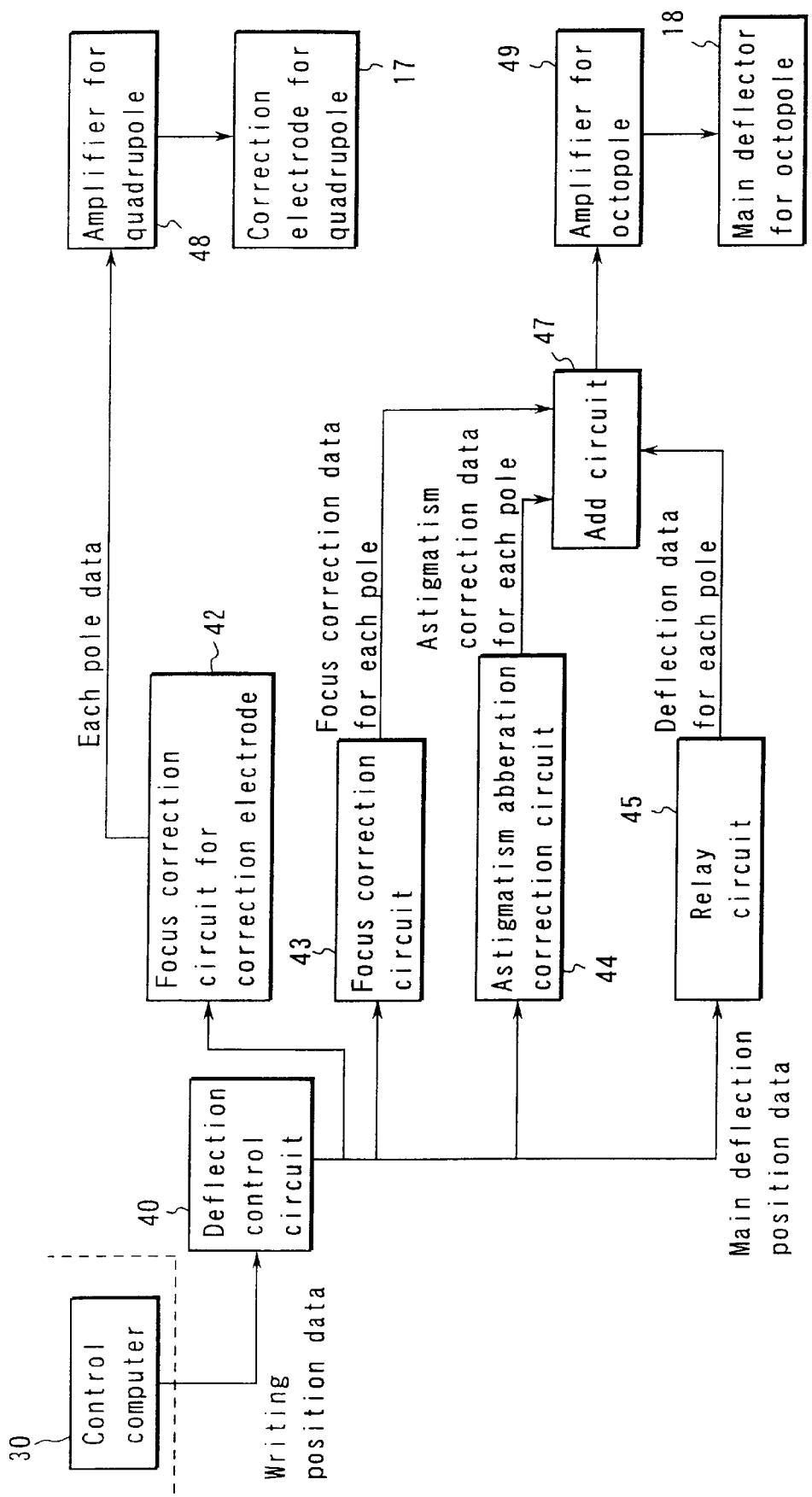
FIG. 7 is a block diagram showing a circuit configuration of a driving portion which drives the correction electrodes and the objective deflector used in the first embodiment.

FIG. 7 is a block diagram showing a circuit configuration of a deflection control portion which drives the correction electrodes and the objective deflector.

Lithography position data is supplied from a control computer 30 to a deflection control circuit 40 in the deflection control portion, and main deflection position data is outputted from this deflection control circuit 40. The main deflection position data is supplied to a focal correction circuit for correction electrode 42, a focus correction circuit 43, an astigmatism aberration correction circuit 44, and a relay circuit 45 together with sample plane height data. Correction data for each electrode is outputted from the correction electrode focal correction circuit 42, and focal correction data for each electrode is outputted from the focal correction circuit 43. Moreover, astigmatic correction data for each electrode is outputted from the astigmatic correction circuit 44, and deflection data for each electrode is outputted from the relay circuit 45.

The correction data is supplied to an amplifier 48, and the amplifier 48 drives the correction electrodes. On the other hand, the focus correction data, the astigmatism aberration correction data and the deflection data are supplied to an add circuit 47 and added up. Thereafter, they are supplied to an amplifier 49, and the amplifier 49 drives the main (objective) deflector 18.

The circuits shown in FIG. 7 are different from the prior art circuits in that the focus correction circuit correction electrode 42, the focus correction circuit 43 and the amplifier 48 are provided and the output data of the focus correction circuit 43 is supplied to the add circuit 47 on the main deflection side.

Description will now be given as to the dynamic focus correction method for an electron beam in this embodiment. When the electron beam is deflected by the objective deflector 18, an image forming position is generally shifted to the upstream side in proportion to a square of a distance from the axis if the lens is adjusted so that a second shaping aperture image is formed on the sample plane on the axis. Thus, the intensity of the quadrupole electric field is determined as follows.

At first, at a maximum deflection position, i.e., a position where the beam is deflected at a maximum level from the axis, a beam monitoring mark (Au particle, for example) on the sample plane 20 is scanned with the electron beam without generating the quadrupole electric field by the correction electrodes 17 and the objective deflector 18. The excitation of the object lens 19 is determined in such a manner that a resulting reflection electron signal intensity profile becomes steepest. In this case, the mark is placed at a lower limit height in a predetermined sample plane height allowable range.

Subsequently, deflection positions of the electron beam are set at a plurality of positions between the maximum deflection position and the axis (namely, the central portion) with the excitation of the object lens 19 being fixed, and the intensity of the quadrupole electric field generated by the correction electrodes 17 and the objective deflector 18 with which the reflection electron signal intensity profile becomes steepest is obtained. The obtained quadrupole electric field intensity profile is stored in a storage device as a calibration table. Thereafter, the mark is set at an upper limit position in the sample plane height allowable range with the excitation of the object lens 19 being fixed, and calibration is carried out. At last, the mark is set at an intermediate position in the sample plane height allowable range, and calibration is conducted.

Then, the intensity of the quadrupole electric field is adjusted based on the calibration table in accordance with both or either of the deflection position and the height of the sample plane at the time of lithography. Any points other than a measurement point, the intensity is determined by carrying out interpolation. As a result, the dynamic focus correction for the electron beam can be performed. In addition, the distribution (profile) of the calibration table may be approximated by an appropriate polynomial in advance and the intensity may be determined based on it.

It is to be noted that the quadrupole magnetic field is generated when the objective deflector is an electromagnetic deflector. In such a case, correction coils which generate the quadrupole magnetic field can be used in place of the correction electrodes 17. In case of using such a quadrupole magnetic field, this field is suitable for the operation at a speed which is lower than that when using an electric field and is not adversely affected by an eddy current.

Additionally, the correction electrodes 17 can be caused to function as stigmators for astigmatism aberration correction. In this case, the quadrupole electric field required for focus correction and the quadrupole electric field required for astigmatism aberration correction must be superposed on each other. Practically, when creating a configuration table of focus correction, for example, it is good enough to create data so that the astigmatism can be minimum by a method such as disclosed in a reference cited ("Advanced e-beam lithography", by T. Takigawa et. Al, Journal of Vacuum and Science Technology, B9(1991), 2981, FIG. 9).

According to the first embodiment, as described above, the dynamic focus correction for the beam can be carried out by adjusting the quadrupole electric field in accordance with a deflection position of the beam by using the correction electrodes 17 including the quadrupole electrodes and the objective deflector 18 including the octopole electrodes, thereby improving the lithography accuracy. Further, in this case, as different from the object lens or the axial symmetric electrostatic lens including the electromagnetic lens, since the correction electrodes 17 as the quadrupole electric field generators and the objective deflector 18 can change the focusing position at a high speed, the dynamic focus correction can be effected at a high speed.

(Second Embodiment)

Figure 8:
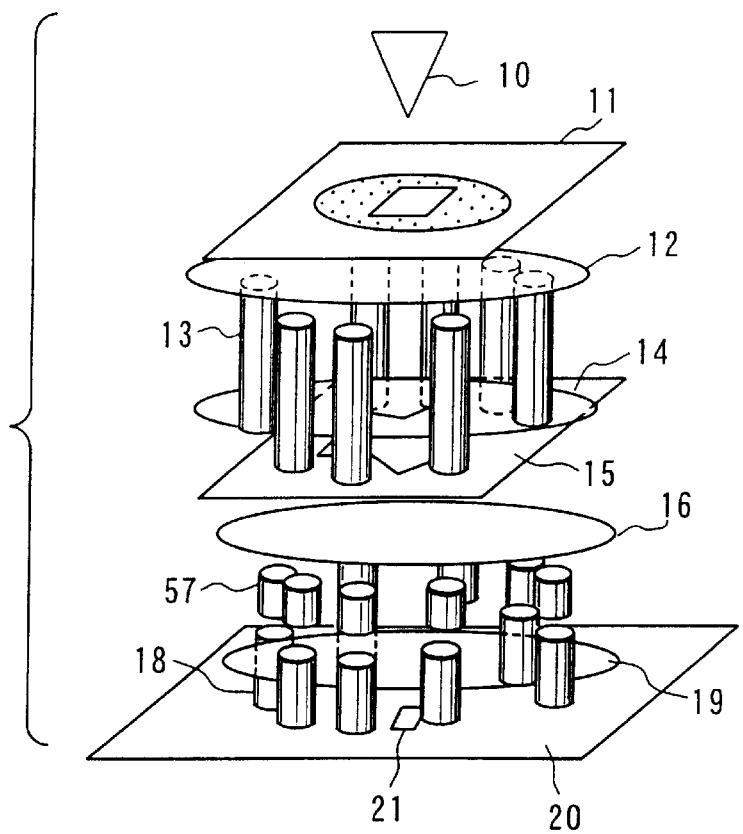
FIG. 8 is a schematic view showing a structure of an optical system of an electron beam exposing apparatus according to a second embodiment.

FIG. 8 is a view showing a structure of an optical system of an electron beam exposing apparatus according to a second embodiment. It is to be noted that like reference numerals denote parts equal to those in FIG. 4, thereby omitting the detailed explanation.

The second embodiment adopts the two-stage deflecting method using the main deflector 18 which deflects a wide range at a low speed and a sub-deflector 57 which deflects a narrow range at a high speed as the objective deflector. Further, there may be provided a sub-of-sub-deflector which deflects a narrower range at a higher speed than that of the sub-deflector in some cases.

Figure 9:
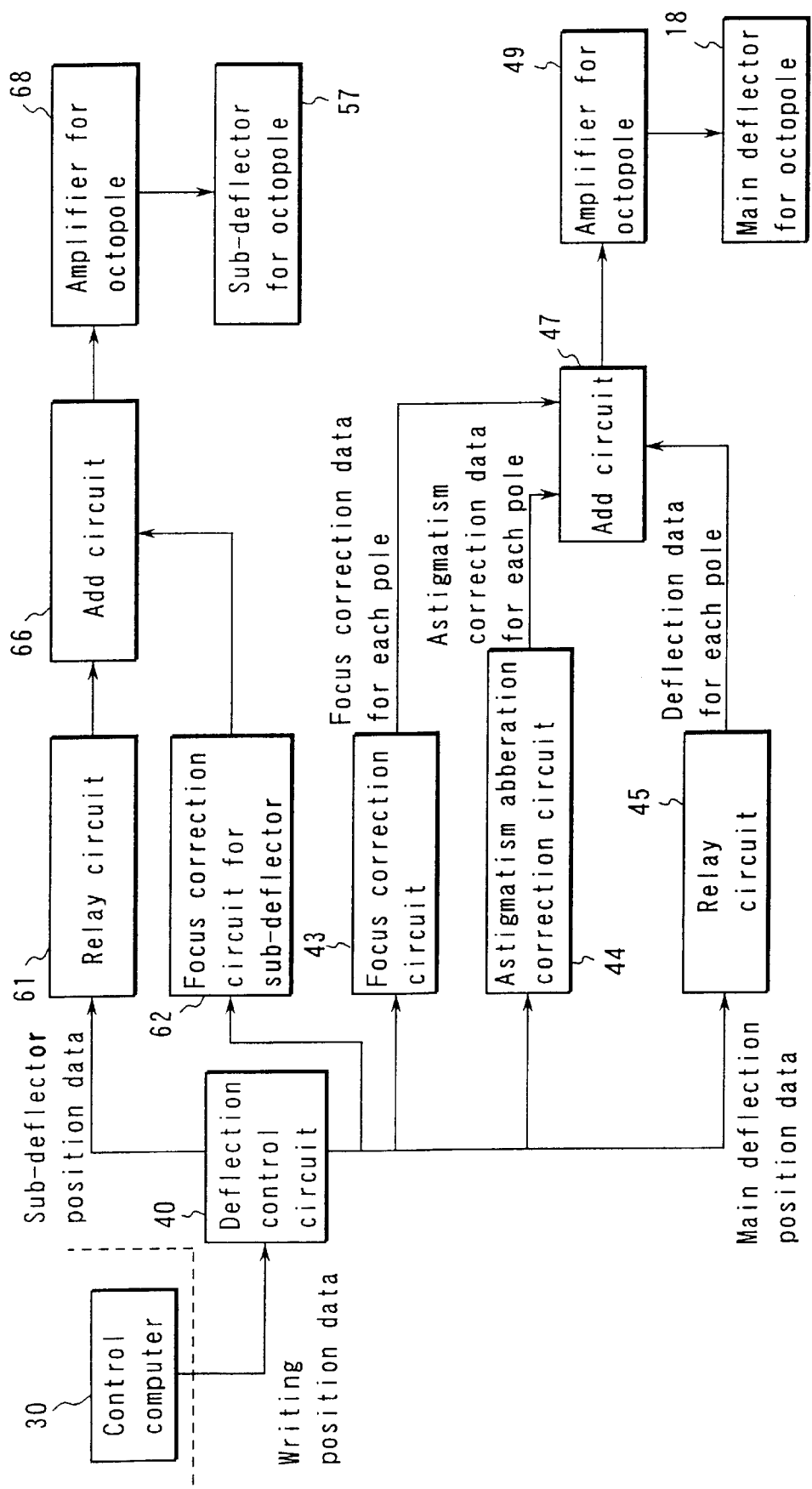
FIG. 9 is a block diagram showing a circuit configuration of a driving portion which drives the correction electrodes and the objective deflector used in the second embodiment.

FIG. 9 is a block diagram showing a circuit configuration of the deflection control portion which drives the correction electrode and the objective deflector. It is to be noted that like reference numerals denote parts similar to those in FIG. 7, thereby omitting the detailed explanation.

FIG. 9 is different from FIG. 7 in that a relay circuit 61, a focus correction circuit for sub-deflector 62, an add circuit 66 and an amplifier 68 are provided in place of the focus correction circuit for correction electrode 42 and the amplifier 48 since the sub-deflector 57 is used for dynamic focal correction for the beam in place of the correction electrodes 17.

The main deflection position data from the deflection control circuit 40 is supplied to the focus correction circuit 43, the astigmatism aberration correction circuit 44 and the relay circuit 45 as well as the focus correction circuit for sub-deflector 62. The sub-deflection position data from the deflection control circuit 40 is supplied to the relay circuit 61. The deflection data for each pole is outputted from the relay circuit 61, and the focus correction data for each pole is outputted from the focus correction circuit for sub-deflector 62. The deflection data and the focus correction data are added up by the add circuit 66, and then supplied to the amplifier 68. Furthermore, the sub-deflector 57 is driven by this amplifier 68.

The correction data for each pole is outputted from the focus correction circuit for sub-deflector 62, and the focus correction data for each pole outputted from the focus correction circuit 43, the astigmatism aberration correction data for each pole outputted from the astigmatism aberration correction circuit 44 and the deflection data for each pole outputted from the relay circuit 45 are supplied to the add circuit 47 and then added up as similar to the first embodiment. Thereafter, data is supplied to the amplifier 49, and the objective deflector 18 is driven by this amplifier 49.

Moreover, in the structure shown in FIG. 8, the astigmatism aberration correction electrode can be used as the sub-deflector. That is, the astigmatism aberration correction and the focus correction can be simultaneously performed by generating the quadrupole electric field in which the quadrupole electric field for the focus correction is superposed on the quadrupole electric field for subjecting to the astigmatism aberration correction as the quadrupole electric field applied to the astigmatism aberration correction electrode. As to the circuit configuration in this case, the relay circuit 61 can be substituted by the astigmatism aberration circuit 61 and the astigmatism aberration correction circuit 44 can be eliminated in FIG. 9.

In the second embodiment, an image forming position of the beam can be corrected by generating the quadrupole electric field in the main deflector 18 and the sub-deflector 57. Additionally, in this case, since both the main deflector 18 and the sub-deflector serve as the correction electrodes, the correction electrode does not have to be additionally provided, which does not result in increase in size of the optical system. This means the existing optical system can be used as it is by changing only the drive circuits for main deflection and sub-deflection, and its practical effect is large.

(Third Embodiment)

Figure 10:
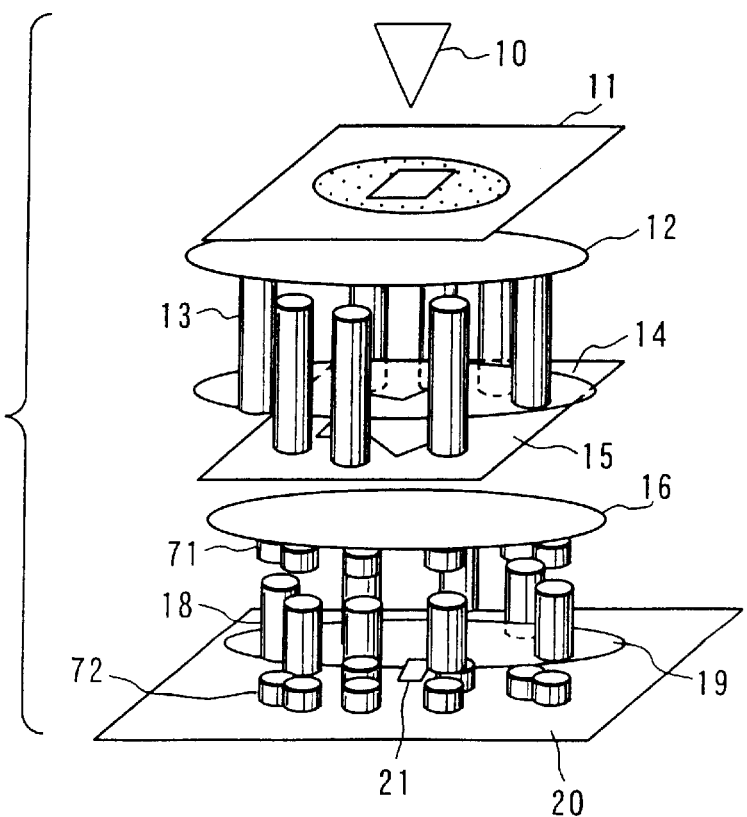
FIG. 10 is a schematic view showing a structure of an optical system of an electron beam exposing apparatus according to a third embodiment.

FIG. 10 is a view showing a structure of an optical system of an electron beam exposing apparatus according to a third embodiment. In the third embodiment, there is shown an example of providing two stages of correction electrodes which are completely independent from the deflector and correcting an image forming position. That is, a first correction electrode 71 is arranged on the upstream side of the objective deflector 18 along the optical axis direction, and a second correction electrode 72 is arranged on the downstream side. In this example, each of the two correction electrodes 71 and 72 is formed of octopole electrodes, and used for only dynamic focus correction and dynamic astigmatism aberration correction. In addition, the objective deflector is used for only deflection.

According to the third embodiment, although the space utilization efficiency is lowered as compared with the first and second embodiments because the correction electrodes 71 and 72 are independently provided, utilizing for the objective deflector a power source dedicated to a deflector can suffice, and hence there is an advantage that the cost of the exposing apparatus can be reduced.

Alternatively, in this structure, the objective deflector 18 can be set so as to generate the quadrupole electric field, and the quadrupole electric field generation areas can be provided at three positions including those of the first and second correction electrodes. By doing so, the anisotropy of magnifying power (property that the magnifying power can differ depending on a direction) which can be a problem when a number of quadrupole electric field generation positions is two can be suppressed. This is effective for increasing a range of dynamic focus correction. Further, when the sub-deflector 57 mentioned in the second embodiment can also serve as either the correction electrode 71 or 72, the space utilization efficiency can be increased.

(Fourth Embodiment)

Although the first to third embodiments have described the examples of forming a pattern by scanning on the sample plane by using the electron beam, the present invention can be applied to the electron beam exposing apparatus which transfers a pattern of a mask onto the sample plane by scanning on the mask by using the electron beam.

Figure 11:
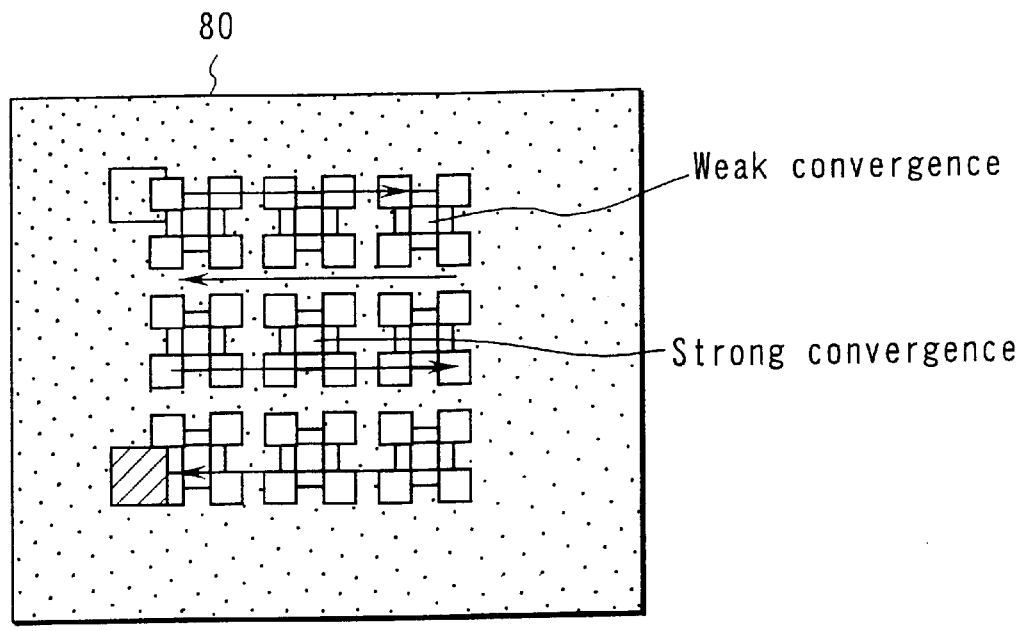
FIG. 11 is a view illustrating a fourth embodiment, and depicts a change in intensity of the converging force by the correction electrodes with respect to a beam position on a mask plane.

In case of this apparatus, as shown in FIG. 11, the focusing position is shifted by the field curvature aberration of a transfer optical system depending on a deflection position of the electron beam on the mask 80. As a countermeasure, for example, two pairs of correction electrodes 71 and 72 or the like illustrated in the third embodiment are used in order to correct a focal point in accordance with a position of the electron beam on the mask 80. That is, the converging force is increased at a central portion of the mask 80, and the converging force is decreased at a peripheral portion of the same. As a result, dynamic focus correction for the beam can be carried out at a high speed.

Figure 12:
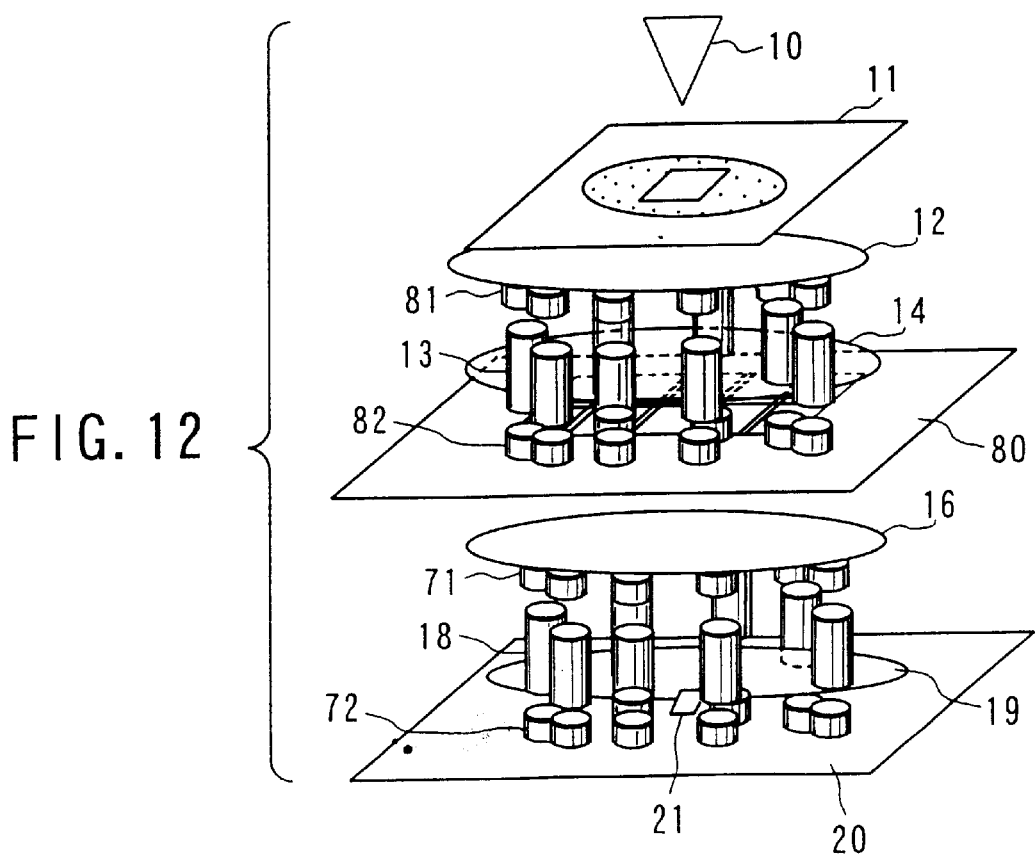
FIG. 12 is a schematic view showing a structure of an optical system in an electron beam exposing apparatus according to the fourth embodiment.

The above can be realized by providing correction electrodes 81 and 82 on the shaping deflector 13 side as shown in FIG. 12. Of course, the converging force can be corrected by providing the correction electrodes 71 and 72 on the objective deflector 18 side as in the third embodiment. The correction electrodes 81 and 82 can be set at any position as long as they are provided between the shaping aperture 11 and the mask 80.

Incidentally, although the examples in which the present invention is applied to the electron beam exposing apparatus have been described in connection with the foregoing embodiments, the present invention is not restricted to the electron beam, and it can be applied to an ion beam exposing apparatus using an ion beam. Furthermore, a number of poles of the correction electrode which generate an electrostatic field is not restricted to 4 or 8, and 4n poles (n is a natural number) can suffice.

Moreover, although examples of providing the function of the correction electrode of dynamic focus correction for the beam to the deflector have been described in connection with the foregoing embodiments, the electrode for astigmatism aberration correction may have the function of the correction electrode.

As described above, according to the foregoing embodiments, at least two pairs of quadrupole field generators which generate the quadrupole field are provided along the beam axis in order to give the converging force to the charged particle beam, and the intensity of the quadrupole field generator is changed in accordance with a deflection position of the charged particle beam on the sample, thereby performing dynamic correction for the charged particle beam at a high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam exposing apparatus comprising:
   a charged particle beam gun;
   a first shaping aperture which forms a charged particle beam from said beam gun into a predetermined shape and passes it therethrough;

a first projection lens which is provided on a downstream side of said first shaping aperture;

a shaping deflector which deflects said charged particle beam which passes through said first projection lens;

a second projection lens on which said charged particle beam which passes through said shaping deflector is incident;

a second shaping aperture which forms said charged particle beam which passes through said second projection lens into a predetermined shape and passes it therethrough;

a reduction lens on which said charged particle beam which passes through said second shaping aperture is incident;

an objective deflector which is provided on a downstream side of said reduction lens and deflects said charged particle beam which passes through said reduction lens;

an object lens on which said charged particle beam which passes through said objective deflector is incident;

a sample base which is provided on a downstream side of said object lens; and at least two pairs of quadrupole field generators which are provided between said second shaping aperture and said sample base along a beam axis so as to give converging force to said charged particle beam and generate a quadrupole field, a field intensity of said quadrupole field generators being variable in accordance with a deflection position of said charged particle beam on a sample mounted on said sample base in order to correct a focusing position of said charged particle beam.

2. The charged particle beam exposing apparatus according to claim 1, wherein said quadrupole field generator includes 4n-pole electrodes which generate an electrostatic field (n is a natural number).

3. The charged particle beam exposing apparatus according to claim 1, wherein one of said quadrupole field generator has four electrodes arranged at each apex of a substantial quadrate with said beam axis at a center, and a direct current voltage is applied between a connection point of one pair of opposed electrodes in said four electrodes and a connection point of the other pair of electrodes.

4. The charged particle beam exposing apparatus according to claim 1, wherein said objective deflector includes an octopole field generator and has eight electrodes arranged at each apex of a substantial octagon with said beam axis at a center, and assuming that an appellation of a pair of opposed electrode is (x, −x); an appellation of a pair of electrodes orthogonal to said pair, (y, −y); appellations of an electrode between x and y and an electrode opposed thereto, ((x+y), −(x+y)); and appellations of an electrode between x and −y and an electrode opposed thereto, ((x−y), −(x−y)) and $V_0$ is a constant when generating a deflection electric field inclined from a direction (y)−(−y) in a counterclockwise direction by θ, voltages V applied to said eight electrodes are as follows:

$$Vx=V_0 \cos(90°-\theta)$$

$$Vx-y=V_0 \cos(45°-\theta)$$

$$-Vy=V_0 \cos(0°-\theta)$$

$$-Vx+y=V_0 \cos(-45°-\theta)$$

$$-Vx=V_0 \cos(-90°-\theta)$$

$$-Vx-y=V_0 \cos(-135°-\theta)$$

$$Vy=V_0 \cos(180°-\theta)$$

$$Vx+y=V_0 \cos(135°-\theta).$$

5. The charged particle beam exposing apparatus according to claim 4, wherein one of said quadrupole field generators also serves as said octopole field generator of said objective deflector and, when ΔV is a constant in case of generating a quadrupole field inclined from a direction (y)−(−y) in the counterclockwise direction by 100/2, voltages V' applied to said eight electrodes of said quadrupole field generator are as follows:

$$Vx'=Vx+\Delta V \cos(\phi)$$

$$Vx-y'=Vx-y-\Delta V \sin(\phi)$$

$$-Vy'=-Vy-\Delta V \cos(\phi)$$

$$-Vx+y'=-Vx+y+\Delta V \sin(\phi)$$

$$-Vx'=-Vx+\Delta V \cos(\phi)$$

$$-Vx-y'=-Vx-y-\Delta V \sin(\phi)$$

$$Vy=Vy-\Delta V \cos(\phi)$$

$$Vx+y'=Vx+y+\Delta V \sin(\phi).$$

6. The charged particle beam exposing apparatus according to claim 1, further comprising a deflection control portion, wherein said deflection control portion comprises:

a deflection control circuit to which lithographing position data is inputted from a control computer and which outputs main deflection position data;

a focus correction circuit for quadrupole to which said main deflection position data is inputted and which outputs focus correction data for each pole of said quadrupole;

an astigmatism aberration correction circuit for objective deflector to which said main deflection position data is inputted and which outputs astigmatism aberration correction data for each pole of said objective deflector;

an astigmatism aberration correction circuit for objective deflector to which said main deflection position data is inputted and outputs deflection data for each pole of said objective deflector; and an add circuit which adds up said focus correction data, said astigmatism aberration correction data and said deflection data and outputs a control signal to said objective deflector.

7. The charged particle beam exposing apparatus according to claim 1, wherein at least one pair of said quadrupole field generators also serve as at least one of an astigmatism aberration corrector and a sub-deflector which supports said objective deflector.

8. A charged particle beam exposing apparatus comprising:

a charged particle beam gun;

a shaping aperture which forms a charged particle beam from said beam gun into a predetermined shape and passes it therethrough;

a first projection lens which is provided on a downstream side of said shaping aperture;

a shaping deflector which deflects said charged particle beam which passes through said first projection lens;

a second projection lens on which said charged particle beam which passes through said shaping deflector is incident;

a mask which forms said charged particle beam which passes through said second projection lens into a predetermined pattern and passes it therethrough;

a reduction lens on which said charged particle beam which passes through said mask is incident;

an objective deflector which is provided on a downstream side of said reduction lens and deflects said charged particle beam;

an object lens on which said charged particle beam which passes through said objective deflector is incident;

a sample base which is provided on a downstream side of said object lens; and at least two pairs of quadrupole field generators which are provided between said mask and said sample base along a beam axis so as to give converging force to said charged particle beam and generate a quadrupole field, a field intensity of said quadrupole field generators being variable in accordance with a deflection position of said charged particle beam on a sample mounted on said sample base in order to correct a focusing position of said charged particle beam.

9. The charged particle beam exposing apparatus according to claim 8, wherein said quadrupole field generator includes 4n-pole electrodes which generate an electrostatic field (n is a natural number).

10. The charged particle beam exposing apparatus according to claim 8, wherein one of said quadrupole field generators has four electrodes arranged at each apex of a substantial quadrate with said beam axis at a center, and a direct current voltage is applied between a connection point of one pair of opposed electrodes among said four electrodes and a connection point of the other pair of electrodes.

11. The charged particle beam exposing apparatus according to claim 8, wherein said objective deflector includes an octopole field generator and has eight electrodes arranged at each apex of a substantial octagon with said beam axis at a center, and assuming that an appellation of a pair of opposed electrode is (x, −x); an appellation of a pair of electrodes orthogonal to said pair, (y, −y); appellations of an electrode between x and y and an electrode opposed thereto, ((x+y), −(x+y)); and an appellation of an electrode between x and −y and an electrode opposed thereto, ((x−y), −(x−y)) and $V_0$ is a constant when generating a deflection electric field inclined from a direction (y)−(−y) in a counterclockwise direction by θ, voltages V applied to said eight electrodes are as follows:

$$Vx = V_0 \cos(90°-\theta)$$

$$Vx-y = V_0 \cos(45°-\theta)$$

$$-Vy = V_0 \cos(0°-\theta)$$

$$-Vx+y = V_0 \cos(-45°-\theta)$$

$$-Vx = V_0 \cos(-90°-\theta)$$

$$-Vx-y = V_0 \cos(-135°-\theta)$$

$$Vy = V_0 \cos(180°-\theta)$$

$$Vx+y = V_0 \cos(135°-\theta).$$

12. The charged particle beam exposing apparatus according to claim 11, wherein one of said quadrupole field generators also serves as said octopole field generator of said objective deflector and, when ΔV is a constant in case of generating a quadrupole field inclined from a direction (y)−(−y) in the counterclockwise direction by φ/2, voltages V' applied to said eight electrode of said quadrupole field generator are as follows:

$$Vx' = Vx + \Delta V \cos(\phi)$$

$$Vx-y' = Vx-y - \Delta V \sin(\phi)$$

$$-Vy' = -Vy - \Delta V \cos(\phi)$$

$$-Vx+y' = -Vx+y + \Delta V \sin(\phi)$$

$$-Vx' = -Vx + \Delta V \cos(\phi)$$

$$-Vx-y' = -Vx-y - \Delta V \sin(\phi)$$

$$Vy' = Vy - \Delta V \cos(\phi)$$

$$Vx+y' = Vx+y + \Delta V \sin(\phi).$$

13. The charged particle beam exposing apparatus according to claim 8, further comprising a deflection control portion, wherein said deflection control portion comprises:

a deflection control circuit to which lithographing position data is inputted from a control computer and which outputs main deflection position data;

a focus correction circuit for quadrupole to which said main deflection position data is inputted and which outputs focus correction data for each pole of said quadrupole;

an astigmatism aberration correction circuit for objective deflector to which said main deflection position data is inputted and which outputs astigmatism aberration correction data for each pole of said objective deflector;

an astigmatism aberration correction circuit for objective deflector to which said main deflection position data is inputted and outputs deflection data for each pole of said objective deflector; and an add circuit which adds up said focus correction data, said astigmatism aberration correction data and said deflection data and outputs a control signal to said objective deflector.

14. The charged particle beam exposing apparatus according to claim 8, wherein at least one pair of said quadrupole field generators also serve as at least one of an astigmatism aberration corrector and a sub-deflector.

15. A charged particle beam exposing apparatus comprising:

a charged particle beam gun;

a shaping aperture which forms a charged particle beam from said beam gun into a predetermined shape and passes it therethrough;

a first projection lens which is provided on a downstream side of said shaping aperture;

a shaping deflector which deflects said charged particle beam which passes through said first projection lens;

a second projection lens on which said charged particle beam which passes through said shaping deflector is incident;

a mask which forms said charged particle beam which passes through said second projection lens into a predetermined pattern and passes it therethrough;

a reduction lens on which said charged particle beam which passes through said mask is incident;

an objective deflector which is provided on a downstream side of said reduction lens and deflects said charged particle beam which passes through said reduction lens;

an object lens on which said charged particle beam which passes through said objective deflector is incident;

a sample base which is provided on a downstream side of said object lens; and at least two pairs of quadrupole field generators which are provided between said shaping aperture and said mask along a beam axis so as to give converging force to said charged particle beam and generate a quadrupole field, a field intensity of said quadrupole field generators being variable in accordance with a deflection position of said charged particle beam on said mask in order to correct a focusing position of said charged particle beam.

16. The charged particle beam exposing apparatus according to claim 15, wherein said quadrupole field generator includes 4n-pole electrodes which generate an electrostatic field (n is a natural number).

17. The charged particle beam exposing apparatus according to claim 15, wherein one of said quadrupole field generators has four electrodes arranged at each apex of a substantial quadrate with said beam axis at a center, and a direct current voltage is applied between a connection point of one pair of electrodes among said four electrodes and a connection point of the other pair of electrodes.

18. The charged particle beam exposing apparatus according to claim 15, wherein said objective deflector includes an octopole field generator and has eight electrodes arranged at each apex of a substantial octagon with said beam axis at a center, and assuming that an appellation of a pair of opposed electrode is (x−x); an appellation of a pair of electrodes orthogonal to said pair, (y, −y); appellations of an electrode between x and y and an electrode opposed thereto, ((x+y), −(x+y)); and appellations of an electrode between x and −y and an electrode opposed thereto, ((x−y), −(x−y)) and $V_0$ is a constant when generating a deflection electric field inclined from a direction (y)−(−y) in a counterclockwise direction by θ, voltages V applied to said eight electrodes are as follows:

$Vx = V_0 \cos(90° - \theta)$ $Vx-y = V_0 \cos(45° - \theta)$ $-Vy = V_0 \cos(0° - \theta)$ $-Vx+y = V_0 \cos(-45° - \theta)$ $-Vx = V_0 \cos(-90° - \theta)$ $-Vx-y = V_0 \cos(-135° - \theta)$ $Vy = V_0 \cos(180° - \theta)$ $Vx+y = V_0 \cos(135° - \theta)$.

19. The charged particle beam exposing apparatus according to claim 15, wherein one of said quadrupole field generators also serves as said octopole field generator of said objective deflector and, when ΔV is a constant in case of generating a quadrupole field inclined from a direction (y)−(−y) in the counterclockwise direction by φ/2, voltages V' applied to said eight electrodes of said quadrupole field generator are as follows:

$Vx' = Vx + \Delta V \cos(\phi)$ $Vx-y' = Vx-y - \Delta V \sin(\phi)$ $-Vy' = -Vy - \Delta V \cos(\phi)$ $-Vx+y' = -Vx+y + \Delta V \sin(\phi)$ $-Vx' = -Vx + \Delta V \cos(\phi)$ $-Vx-y' = -Vx-y - \Delta V \sin(\phi)$ $Vy' = Vy - \Delta V \cos(\phi)$ $Vx+y' = Vx+y + \Delta V \sin(\phi)$.

* * * * *